United States Patent
Kuznetsov et al.

(10) Patent No.: US 8,721,032 B2
(45) Date of Patent: May 13, 2014

(54) METHOD FOR MONITORING A JETTING PERFORMANCE OF A PRINT HEAD

(75) Inventors: Evgenij V. Kuznetsov, Venlo (NL); Mircea V. Rasa, Eindhoven (NL)

(73) Assignee: Oce-Technologies B.V., Venlo (NL)

( * ) Notice: Subject to any disclaimer, the term of this patent is extended or adjusted under 35 U.S.C. 154(b) by 120 days.

(21) Appl. No.: 13/602,838

(22) Filed: Sep. 4, 2012

(65) Prior Publication Data

US 2013/0021404 A1    Jan. 24, 2013

Related U.S. Application Data

(63) Continuation of application No. PCT/EP2011/053195, filed on Mar. 3, 2011.

(30) Foreign Application Priority Data

Mar. 18, 2010  (EP) ..................................... 10156856

(51) Int. Cl.
*B41J 29/393*    (2006.01)
(52) U.S. Cl.
USPC .......................................................... 347/19
(58) Field of Classification Search
USPC ............................................. 347/19, 23, 53
See application file for complete search history.

(56) References Cited

U.S. PATENT DOCUMENTS

| | | | |
|---|---|---|---|
| 5,876,615 | A | 3/1999 | Predetechensky |
| 6,202,734 | B1 | 3/2001 | Sackinger et al. |
| 2006/0102663 | A1 | 5/2006 | McGeoch |
| 2006/0193997 | A1 | 8/2006 | Bykanov |

FOREIGN PATENT DOCUMENTS

| | | |
|---|---|---|
| EP | 0 491 599 A1 | 6/1992 |
| EP | 1 013 453 A2 | 6/2000 |
| JP | 01-113254 A | 5/1989 |
| WO | WO 2007/038987 A1 | 4/2007 |

*Primary Examiner* — Julian Huffman
(74) *Attorney, Agent, or Firm* — Birch, Stewart, Kolasch & Birch, LLP

(57) ABSTRACT

The invention relates to a method for monitoring a performance of a jetting device, the jetting device being configured to expel droplets of an electrically conductive fluid wherein at least a part of the conductive fluid is positioned in a magnetic field, the method comprising providing an electrical actuation current in the part of the conductive fluid positioned in the magnetic field, thereby generating a pressure wave in the conductive fluid; characterized in that the method further comprises detecting a resulting electrical current, which electrical current is induced by a residual pressure wave in the part of the conductive fluid positioned in the magnetic field, thereby obtaining a detection signal and based on the detection signal determining whether the jetting device is in an operative state. The invention further relates to a printing device, employing the described method.

5 Claims, 3 Drawing Sheets

METHOD FOR MONITORING A JETTING PERFORMANCE OF A PRINT HEAD

This application is a Continuation of PCT International Application No. PCT/EP2011/053195 filed on Mar. 3, 2011, which claims priority under 35 U.SC. §119(a) to Patent Application No. 10156856.6 filed in Europe on Mar. 18, 2010. The entire contents of each of the above documents is hereby incorporated by reference into the present application.

The present invention relates to a method and system for jetting conductive fluids and more in particular to a method and a system for monitoring a jetting performance of said method and system.

BACKGROUND OF THE INVENTION

A printing device for ejecting droplets of an electrically conductive fluid such as a molten metal is known. In such a printing device, a Lorenz force is generated in the molten metal due to which a droplet is expelled through a nozzle of the printing device. Such a device may be used for ejecting droplets of a fluid having a high temperature, such as a molten metal or a molten semiconductor.

Direct printing of molten metals may be employed for printing electronic circuitry, for example. In such an application it is essential that all droplets are actually printed accurately as otherwise the electronic circuitry may not function due to an interruption in the electronic connections as a result of a missing droplet, for example. Therefore, it is desirable to at least monitor that all droplets are actually generated.

Monitoring may be performed by applying a scanning unit that images the printed dots. Such a monitoring system may however be insufficient for correcting any missing or misdirected dots. Therefore, it is desirable to have a system that is able to monitor continuously whether the nozzles of a printing system function properly.

EP 1013453 B1 describes a method for monitoring whether a nozzle operates properly. A printing apparatus is described, which is adapted to eject ink droplets from a nozzle, comprising at least one nozzle provided with an electromechanical transducer, a drive circuit provided with a pulse generator to energise the transducer, a measuring circuit for measuring an electrical signal generated by the transducer in response to energisation, and means to break the circuits in such manner that the drive circuit is open if the measuring circuit is closed. An example of an electromechanical transducer is a piezo element. Such an element changes shape when a voltage is applied to it. This leads to the ejection of a droplet of ink. After a droplet has been ejected, there will be a residual pressure in the nozzle. Because of this pressure, the piezo element will generate an electric signal, which may be measured, as a current or a voltage. The electric signal is dependent of the state of the nozzle. For example, if there is an air bubble present in the nozzle, the damping (residual pressure as a function of time) will be different than in the case of a completely full nozzle. In the process, the piezo element is switched into a measuring circuit after expiry of the actuation so that the said electric signal can be measured. By comparison with a reference signal, i.e. the signal generated by the transducer of a nozzle defined as normal, it is then possible to determine whether the nozzle is in good condition or whether there is a problem which may influence the print quality. If a deviation is found, a repair action may be carried out, for example flushing with ink. In brief, using the known method, it is possible to check continuously for proper operation of a nozzle and repair if a problem occurs. In this way, a permanently good print quality can be achieved.

However, to carry out this method of monitoring the state of a nozzle, a piezo element is necessary. A piezo element cannot operate and function properly under certain conditions, such as at a high temperature. As a consequence, in a printing apparatus adapted to jet fluid at a high temperature, such as a printing apparatus adapted to jet molten metals, a piezo element cannot be used. Therefore, the solution proposed in the cited document, is not suitable for use in this field of technology.

It is an object of the invention to provide a method and a system for monitoring a jetting performance of a system being able to jet conductive fluids.

SUMMARY OF THE INVENTION

The above object is achieved in a method for monitoring a performance of a jetting device, the jetting device being configured to expel droplets of an electrically conductive fluid wherein at least a part of the conductive fluid is positioned in a magnetic field, the method comprising providing an electrical actuation current in the part of the conductive fluid positioned in the magnetic field, thereby generating a pressure wave in the conductive fluid; characterized in that the method further comprises detecting a resulting electrical current, which electrical current is induced by a residual pressure wave in the part of the conductive fluid positioned in the magnetic field, thereby obtaining a detection signal; and based on the detection signal determining whether the jetting device is in an operative state.

In a known system for printing an electrically conductive fluid, a droplet of said electrically conductive fluid is expelled through a nozzle by a Lorenz force. This force causes a motion in the conductive fluid. This motion causes differences in pressure throughout the fluid, also known as a pressure wave. The Lorenz force is related to the electric current and the magnetic field vector; $\vec{F}=\vec{I}\times\vec{B}$. In the system according to the present invention, the magnetic field is provided and an electrical current is provided in the conductive fluid, such that a suitable force for ejecting a droplet is generated. When a droplet of fluid is ejected, differences in pressure are generated throughout the fluid, as explained above and a pressure wave is created. Due to inertia, the pressure wave does not disappear momentarily as soon as the application of the electrical current is stopped, but will gradually fade in the course of time. The residual pressure wave as a function of time will depend, amongst others, on the acoustic behavior of the fluid chamber. The pressure wave will generate motion in the conductive fluid, which will fade in the course of time, like the pressure wave. The motion in the conductive fluid generates a force. Thus, after ejection of a droplet, a force is generated in the fluid. Since the conductive fluid is positioned in a magnetic field, an induced current ($\vec{I}$) is generated in the fluid, because of the relation $\vec{F}=\vec{I}\times\vec{B}$. By measuring this current, the acoustics in the actuation chamber may be monitored.

However, also in the case that providing an electrical current in the presence of a magnetic field does not lead to the ejection of a droplet, still the acoustic behavior of the fluid may be monitored. As explained above, applying an electrical current through a conductive fluid in a magnetic field generates a Lorenz force, which results in a pressure wave in the conductive fluid that will gradually fade in the course of time. The residual pressure wave as a function of time will depend, amongst others, on the acoustic behavior of the fluid chamber. The acoustic behavior includes inter alia the resonances due to the shape of the fluid chamber and due to the presence or absence of fluid. The pressure wave corresponds to a force in the conductive fluid. Since a magnetic field is applied to the conductive fluid, the corresponding force will induce a current through the fluid, in accordance with $\vec{F}=\vec{I}\times\vec{B}$, which may be sensed by suitable means. By measuring this current, the acoustic behavior of the actuation chamber may be monitored.

In the present invention, the actuation is performed by actuation means that may generate a pressure wave in the fluid for ejecting a droplet of the fluid from a fluid chamber through an orifice and an induced current may be measured directly after actuation, the actuation being such that in case the nozzle is operating as normal a droplet of the fluid is ejected. It is an advantage of the present invention that the jetting performance of a nozzle may be monitored during printing. An additional advantage is that the breakdown or malfunction of the nozzle may be detected practically immediately, so that in many cases a repair operation may be carried out possibly even before any artifacts have appeared. Therefore, the method according to the present invention improves the reliability of a printing apparatus. As stated above, in case the printing device is applied to print an electric circuitry, any missing droplet of fluid would have a detrimental effect on the functionality of the print results.

In an embodiment, the step of the method in which it is determined based on the detection signal whether the jetting device is in an operative state comprises comparing at least one property of the detection signal with a property of a predetermined detection signal, which predetermined signal corresponds to an operative state of the jetting device. After a Lorenz force has been generated by applying an electric actuation current in the presence of a magnetic field, a residual pressure wave in the conductive fluid induces a current in the conductive fluid, which may be monitored by suitable detection means. The induced current produced after actuation is dependent on the state of the jetting device. A reference electrical signal may be predetermined for the induced current generated after actuation, for example by monitoring the induced current after actuation of a properly functioning jetting device. By comparison of a measured electrical signal with the predetermined reference electrical signal, it may be determined whether the jetting device functions properly or not.

The induced current depends on a variety of parameters. In particular, the acoustics of the fluid chamber inter alia determine the residual pressure waves in the conductive fluid. So, from the induced current, it may be determined whether the acoustics of the fluid chamber correspond to those of an operative chamber. In case dirt or other obstructions are present, the acoustics will be different and hence, it may be determined that a fluid chamber is not in an operative state. For example, it may be determined based on the detection signal that droplets are jetted in a wrong direction, or that no droplets are jetted at all.

In an embodiment, the method for monitoring the performance of a jetting device comprises a jetting device comprising two electrodes in contact with the conductive fluid for providing the electrical current in the conductive fluid, said two electrodes are, during providing the electrical actuation current, operatively connected to an electrical current generating unit and said two electrodes are, during detecting a resulting electrical current, operatively connected to an electronic signal detection unit. Thus, in this embodiment, the detection unit does not receive the actuation current and the detection unit may therefore be dedicated for accurately detecting the comparatively weak induced electrical signal.

In an aspect, the present invention further provides a printing device for printing a droplet of an electrically conductive fluid, the printing device comprising a fluid chamber for holding an amount of the electrically conductive fluid; and an actuation assembly configured to expel droplets of the electrically conductive fluid from the chamber through a nozzle, the actuation assembly comprising a magnetic field generating unit for generating a magnetic field in at least a part of the fluid chamber; and an electrical current generating unit for generating an electrical actuation current in the electrically conductive fluid in the part of the chamber provided with the magnetic field, thereby generating a pressure wave in the conductive fluid in said part of the fluid chamber, an electrical signal detecting unit for detecting a resulting electrical current, which resulting electrical current is induced by a residual pressure wave in the part of the conductive fluid positioned in the magnetic field, thereby obtaining a detection signal. The printing device according to the present invention is thus configured for performing the method according to the present invention.

In an embodiment of the printing device, the electrical current generating unit is operatively connectable to two electrodes, the two electrodes being in contact with the conductive fluid for providing the electrical actuation current in the conductive fluid, and the printing device being configured such that the two electrodes are operatively connected to the electrical current generating unit upon actuation and such that the two electrodes are operatively connected to the electrical signal detection unit after actuation. The printing device comprises switching means for switching from a drive circuit to a measuring circuit and vice versa.

The actuation current may be significantly larger than the induced current. Since the electrodes are operatively connected to the electrical signal detection unit after actuation, the induced current may be measured using a sensitive signal detection means, adapted to detect the weak induced current.

BRIEF DESCRIPTION OF THE DRAWINGS

These and further features and advantages of the present invention are explained hereinafter with reference to the accompanying drawings showing non-limiting embodiments and wherein.

In the drawings, same reference numerals refer to same elements.

DETAILED DESCRIPTION OF THE DRAWINGS

Figure 1:
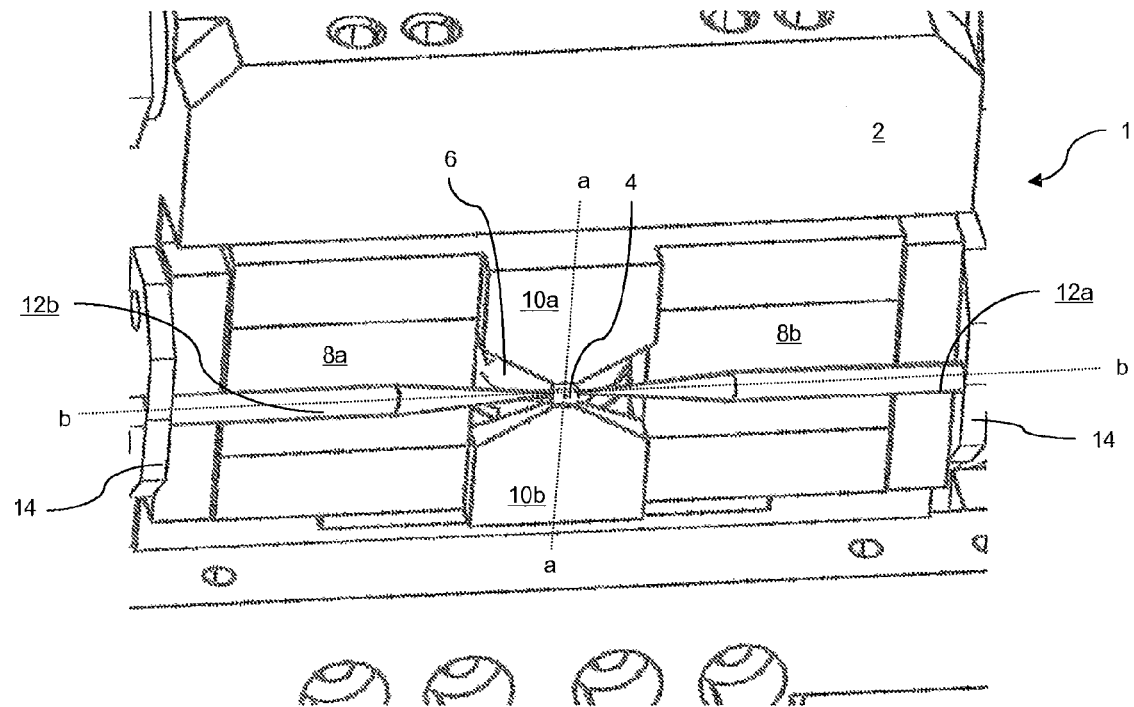
FIG. 1 shows a perspective view of a printing device for printing droplets of an electrically conductive fluid.

FIG. 1 shows a part of a jetting device 1 for ejecting droplets of a relatively hot fluid, in particular a molten metal such as copper, silver, gold and the like. The jetting device 1 comprises a support frame 2, made of a heat resistant and preferably heat conductive material.

The jetting device 1 is provided with an ejection nozzle 4 through which a droplet of the fluid may be ejected. The nozzle or orifice 4 is a through hole extending through a wall of a fluid chamber body 6. In the fluid chamber body 6 a fluid chamber is arranged. The fluid chamber is configured to hold the fluid.

For ejecting droplets of molten metal, the jetting device 1 is provided with two permanent magnets 8a, 8b (hereinafter also referred to as magnets 8). The magnets 8 are arranged between two magnetic field concentrating elements 10a, 10b (hereinafter also referred to as concentrators 10) made of magnetic field guiding material such as iron. The jetting device 1 is further provided with two electrodes 12a, 12b (hereinafter also referred to as electrodes 12) both extending into the fluid chamber body 6 through a suitable through hole such that at least a tip of each of the electrodes 12 is in direct electrical contact with the molten metal present in the fluid chamber. The electrodes 12 are supported by suitable electrode supports 14 and are each operatively connectable to a suitable electrical current generator (not shown) such that a suitable electrical current may be generated through the electrodes 12 and the molten metal present between the tips of the electrodes 12. The electrodes 12 may be each operatively connectable to an electrical signal detection unit (not shown), such that a resulting current, induced by a residual pressure wave in the part of the fluid positioned in the magnetic field, may be monitored. This is further elucidated herein below.

Figure 2:
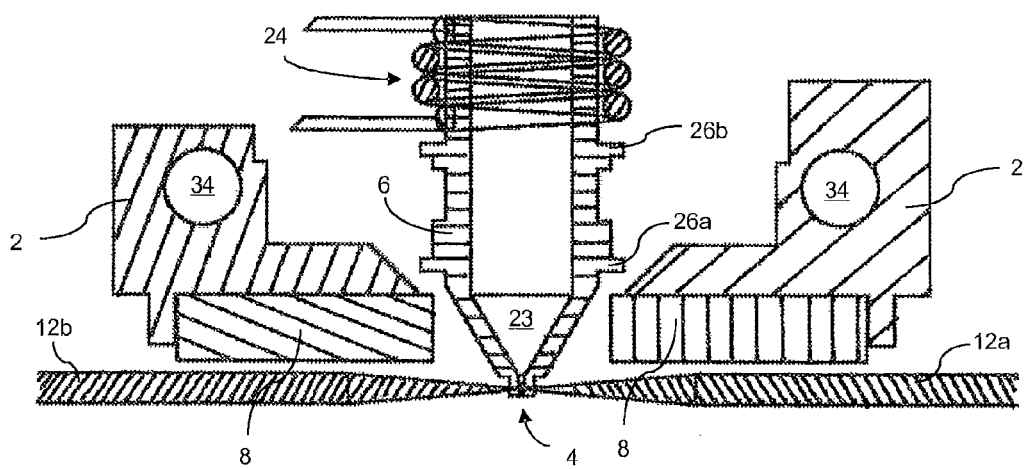
FIG. 2 shows a cross-sectional view of a part of the printing device shown in FIG. 1.

FIG. 2 shows a cross-section of the embodiment illustrated in FIG. 1, which cross-section is taken along line b-b (FIG. 1). Referring to FIG. 2, the support frame 2 and the magnets 8 are shown. In the illustrated embodiment, the support frame 2 is provided with cooling channels 34 through which a cooling liquid may flow for actively cooling of the support frame 2 and the magnets 8. An induction coil 24 is shown. The fluid chamber body 6 is arranged in a center of the induction coil 24 such that a current flowing through the induction coil 24 results in heating of a metal arranged in the fluid chamber 6. Due to such heating the metal may melt and thus become a fluid. Such inductive heating ensures a power-efficient heating and no contact between any heating element and the fluid, limiting a number of (possible) interactions between elements of the jetting device 1 and the fluid. Nevertheless, in other embodiments, other means for heating the metal in the fluid chamber may be applied.

Figure 3A:
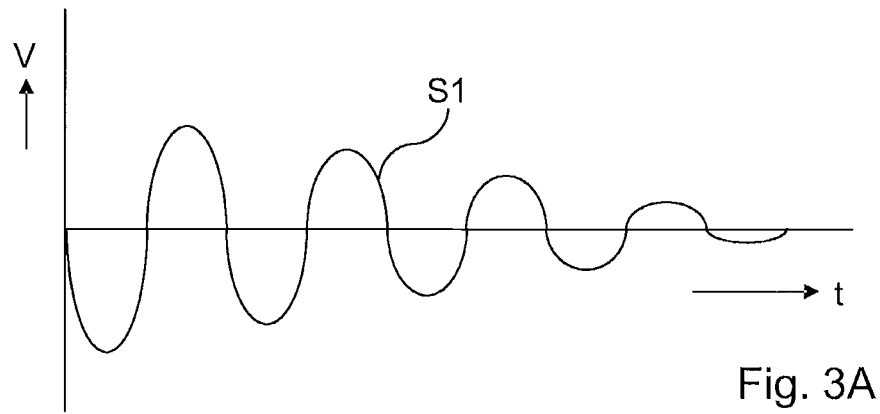
FIG. 3A-3C show a number of fictitious electrical signals that could have been induced in a conductive fluid corresponding to a condition of the nozzle.
Figure 3B:
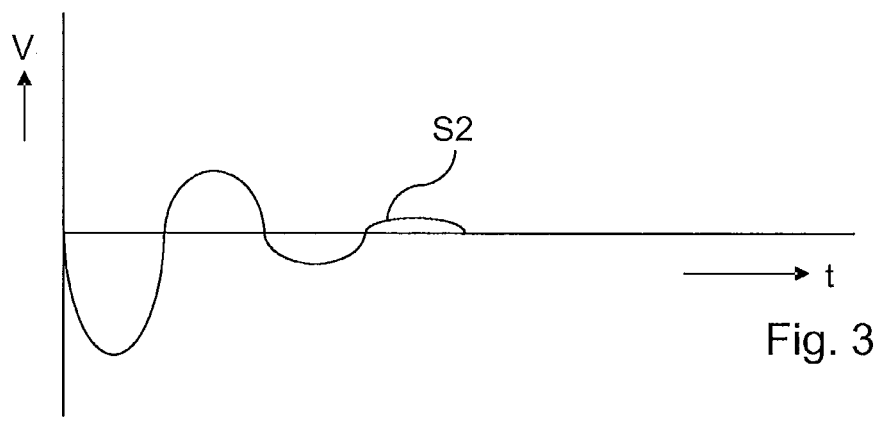
Figure 3C:
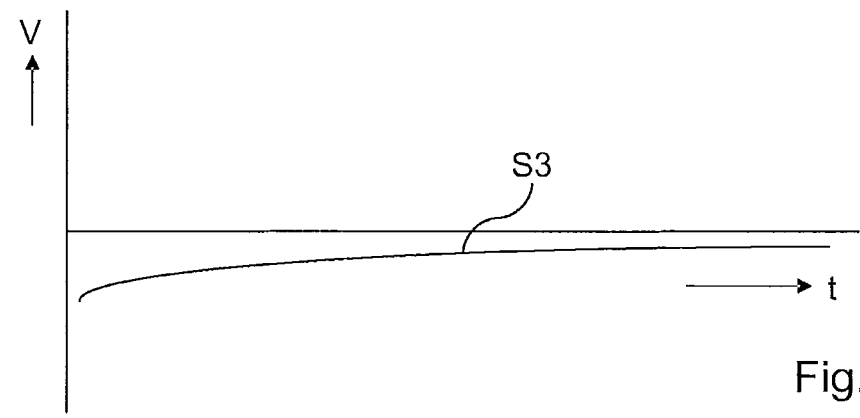

FIG. 3A-3C show a number of fictitious electrical signals S1-S3 as may be generated by a transducer in response to a pressure wave in a conductive fluid in a fluid chamber body, dependent on the state of said fluid chamber. The fictitious electrical signals are shown for illustrative purposes. If a jetting device is operating properly, the result is a damped electrical signal S1 as shown in FIG. 3A. For a given fluid chamber geometry, the presence of a solid particle may result in an altered electrical signal S2 as shown in FIG. 3B. This altered signal S2 has a lower frequency, lower initial amplitude and stronger damping as the damped signal S1 shown in FIG. 3A. Finally, FIG. 3C shows a fictitious example of a faulty electrical signal S3 as may be measured in the case of malfunctioning of the electrodes.

The measurement may be used, for example, to check the operation of the individual nozzles after production of a printhead provided with one or more such nozzles. If errors have occurred in production, e.g. a scratch in a wall of a nozzle, a faulty electrode etc., these faults may be recognisable and may be repaired, if possible.

In the case of a printing apparatus in use, the measurement may be used to check the state of the nozzles without significant loss of productivity. The high accuracy with which irregularities in a nozzle may be detected may even make it possible to carry out preventive maintenance on nozzles, i.e. before there is any question of malfunction of a jetting device.

Figure 4:
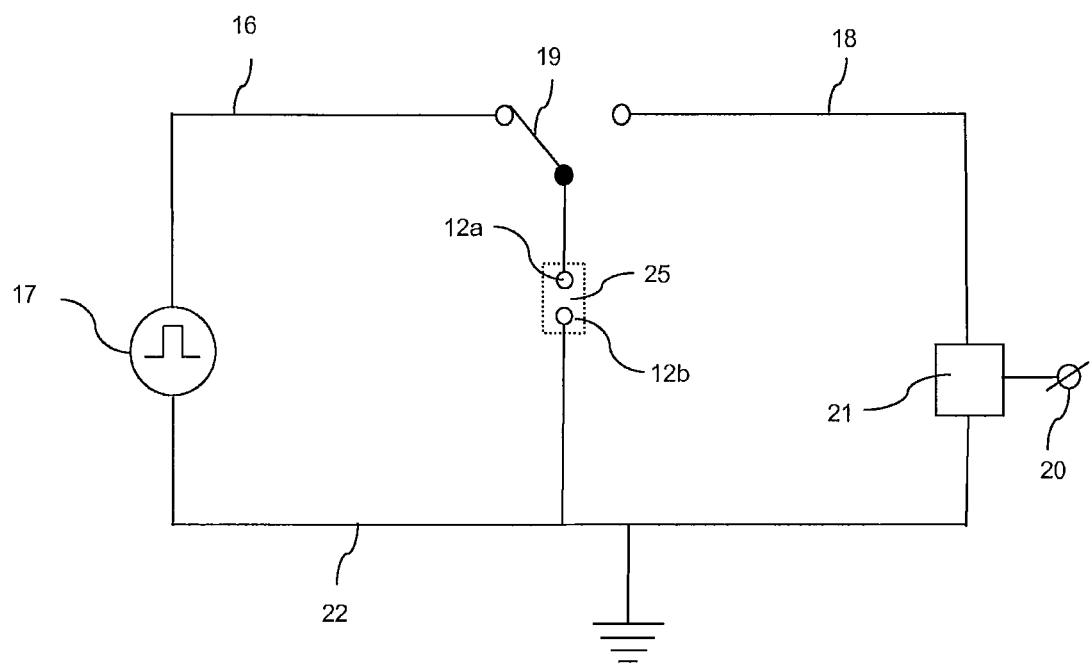
FIG. 4 is a diagram showing an electric circuit suitable for use in the method according to the present invention.

FIG. 4 is a schematic circuit diagram of an embodiment of an electrical circuit including the electrodes 12a and 12b (hereinafter referred to as electrodes 12), the drive circuit 16 and the measuring circuit 18. The electrodes 12 are in contact with a conductive fluid 25 for providing an electrical current in the conductive fluid 25. The drive circuit 16 is provided with an electrical current generating unit 17, for generating an electrical current, which is used among others to generate a Lorenz force in the conductive fluid 25. The measuring circuit 18 is provided with a sensor means 21, for detecting the current induced in the system after a pulse has been terminated. The drive circuit 16 and the measuring circuit 18 are connected to the electrodes 12 via a common line 22. The circuits 16, 18 are connectable through a changeover switch 19.

In operation, after a pulse has been applied across the electrodes 12 by the electrical current generating unit 17, the electrodes 12 in turn experience a current induced by a residual motion of the conductive fluid in the ink duct, as above described. When, after termination of the pulse, the changeover switch 19 is switched so as to close the measuring circuit 18, said induced current is discharged through the measuring circuit 18. The induced current is detected by the sensor means 21. The induced current may be fed via the output terminal 20 to a signal processing unit (not shown) for further processing.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually and appropriately detailed structure. In particular, features presented and described in separate dependent claims may be applied in combination and any combination of such claims are herewith disclosed. Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention claimed is:

1. Method for monitoring a performance of a jetting device, the jetting device being configured to expel droplets of an electrically conducting fluid wherein at least a part of the conductive fluid is positioned in a magnetic field, the method comprising
   a) providing an electrical actuation current in the part of the conductive fluid positioned in the magnetic field, thereby generating a pressure wave in the conductive fluid;
characterized in that the method further comprises
   b) detecting a resulting electrical current, which electrical current is induced by a residual pressure wave in the part of the conductive fluid positioned in the magnetic field, thereby obtaining a detection signal; and
   c) based on the detection signal determining whether the jetting device is in an operative state.

2. Method according to claim 1, wherein step (c) comprises comparing at least one property of the detection signal with a property of a predetermined detection signal corresponding to an operative state of the jetting device.

3. Method according to claim 1, wherein the jetting device comprises two electrodes in contact with the conductive fluid for providing the electrical current in the conductive fluid and wherein in step (a) the two electrodes are operatively connected to an electrical current generating unit and wherein in step (b) the two electrodes are operatively connected to an electronic signal detection unit.

4. Printing device for printing a droplet of an electrically conductive fluid, the printing device comprising
- a fluid chamber for holding an amount of the electrically conductive fluid; and
- an actuation assembly configured to expel droplets of the electrically conductive fluid from the chamber through a nozzle, the actuation assembly comprising
  - a magnetic field generating unit for generating a magnetic field in at least a part of the fluid chamber; and
  - an electrical current generating unit for generating an electrical actuation current in the electrically conductive fluid in the part of the chamber provided with the magnetic field, thereby generating a pressure wave in the conductive fluid in said part of the fluid chamber,
- an electrical signal detecting unit for detecting a resulting electrical current, which resulting electrical current is induced by a residual pressure wave in the part of the conductive fluid positioned in the magnetic field, thereby obtaining a detection signal.

5. Printing device according to claim 4, wherein the electrical current generating unit is operatively connectable to two electrodes in contact with the conductive fluid for providing the electrical actuation current in the conductive fluid, the printing device being configured such that the two electrodes are operatively connected to the electrical current generating unit upon actuation and such that the two electrodes are operatively connected to the electrical signal detection unit after actuation.

* * * * *